United States Patent [19]

Sentoku et al.

[11] Patent Number: 5,717,492
[45] Date of Patent: Feb. 10, 1998

[54] POSITION DETECTING APPARATUS AND A METHOD FOR MANUFACTURING SEMICONDUCTOR DEVICES USING THE APPARATUS

[75] Inventors: Koichi Sentoku, Kanagawa-ken; Kenji Saitoh, Atsugi; Hiroshi Osawa, Yokohama; Masanobu Hasegawa, Utsunomiya, all of Japan

[73] Assignee: Canon Kabushiki Kaisha, Tokyo, Japan

[21] Appl. No.: 788,350

[22] Filed: Jan. 27, 1997

Related U.S. Application Data

[63] Continuation of Ser. No. 325,822, Oct. 19, 1994, abandoned.

[30] Foreign Application Priority Data

Oct. 20, 1993 [JP] Japan ................... 5-285941

[51] Int. Cl.[6] ................................................. G01B 11/00
[52] U.S. Cl. ................................................. 356/401; 250/548
[58] Field of Search ........................... 356/349, 399–401, 356/356; 250/548, 559.3

[56] References Cited

U.S. PATENT DOCUMENTS

| | | | |
|---|---|---|---|
| 4,037,969 | 7/1977 | Feldman et al. . | |
| 5,114,236 | 5/1992 | Matsugu et al. | 356/401 |
| 5,196,711 | 3/1993 | Matsugu et al. | 250/548 |
| 5,200,800 | 4/1993 | Suda et al. | 356/401 |
| 5,285,259 | 2/1994 | Saitoh | 356/401 |
| 5,291,023 | 3/1994 | Hasegawa et al. | 250/548 |
| 5,313,272 | 5/1994 | Nose et al. | 356/356 |
| 5,333,050 | 7/1994 | Nose et al. | 356/356 |
| 5,369,486 | 11/1994 | Matsumoto et al. | 356/349 |
| 5,396,335 | 3/1995 | Hasegawa et al. | 356/401 |

FOREIGN PATENT DOCUMENTS

| | | |
|---|---|---|
| 56-157033 | 12/1981 | Japan . |
| 61-114402 | 6/1986 | Japan . |
| 2167413 | 6/1990 | Japan . |

*Primary Examiner*—K. Hantis
*Attorney, Agent, or Firm*—Fitzpatrick, Cella, Harper & Scinto

[57] ABSTRACT

A position detection apparatus and method detects the relative positional relationship between first and second objects facing each other in a facing direction. First, second and third marks each serving as a physical optical element are provided on the first object, while a fourth mark serving as a physical optical element is provided on the second object. A light projector projects light onto the first and second objects A light detector detects a first light beam diffracted by the first mark and reflected by the second object, a second light beam diffracted by the second mark and reflected by the second object, and a third light beam diffracted by the third and fourth marks. A first position detector detects the relative positional relationship between the first and second objects in the facing direction based on signals representing the first and second light beams from the light detector. A second position detector detects the relative positional relationship between the first and second objects in a direction perpendicular to the facing direction based on signals representing the first, second and third light beams from the light detector.

19 Claims, 13 Drawing Sheets

5,717,492

1

POSITION DETECTING APPARATUS AND A METHOD FOR MANUFACTURING SEMICONDUCTOR DEVICES USING THE APPARATUS

This application is a continuation of application Ser. No. 08/325,822 filed Oct. 19, 1994, now abandoned.

BACKGROUND OF THE INVENTION

1. Field of the Invention

This invention relates to a position detection apparatus and a method for manufacturing semiconductor devices using the apparatus, which are suitable in a case, in which, for example, in an exposure apparatus for manufacturing semiconductor devices, when exposing and trasferring a fine electronic-circuit pattern formed on the surface of a first object, such as a mask, a reticle or the like (hereinafter termed a "mask") onto the surface of a second object, such as a wafer or the like, the interval between the mask and the wafer is measured and controlled to a predetermined value (the setting of the interval), and relative in-plane positioning (alignment) between the mask and the wafer is performed.

2. Description of the Related Art

In exposure apparatuses for manufacturing semiconductor devices, the setting of the interval and relative positioning between the mask and the wafer have been important factors for improving the performance of obtained devices. Particularly, in the interval setting and alignment in recent exposure apparatuses, for example, accuracy of less than a micrometer has been required in order to provide semiconductor devices having high integration.

In such an exposure apparatus, after measuring the interval between the mask and the wafer by an intersurface-interval measuring apparatus or the like and controlling the interval to a predetermined value, the mask and the wafer are aligned with each other utilizing position information obtained from so-called alignment patterns provided on the surfaces of the mask and the wafer. The alignment is performed, for example, by detecting the amount of deviation between the two alignment patterns by performing image processing, or, as proposed in U.S. Pat. No. 4,037,969 or Japanese Patent Laid-open Application (Kokai) No. 58-157033 (1981), by using a zone plate as the alignment pattern, projecting a light beam onto the zone plate, and detecting the position of the focal point of the light beam emanating from the zone plate on a predetermined surface.

In general, the alignment method utilizing zone plates achieves relatively high-accuracy alignment without being influenced by defects in the alignment marks, compared with the method using only alignment marks.

FIG. 1 is a schematic diagram of a conventional position detection apparatus utilizing zone plates.

In FIG. 1, parallel light beams emitted from a light source 72 pass through a half-mirror 74, are then focused onto a focal point 78 by a condenser lens 78, and illuminate a mask alignment pattern 168a on the surface of a mask 168, and a wafer alignment pattern 160a on the surface of a wafer 160 mounted on a support 162. Each of these alignment patterns 168a and 160a comprises a reflecting zone plate, and forms a focal point on a plane orthogonal to an optical axis including the focal point 78. The amount of deviation of the focal point on the plane at that time is detected by guiding the light beams onto a detector 82 by the half mirror 74 and a lens 80.

The alignment between the mask 168 and the wafer 160 is performed by driving a driving circuit 164 to drive a control element 70 controlling the movement of the mask 168 and to drive a control element 166 controlling movement of the support 162 by a control circuit 84 based on an output signal from the detector 82.

FIG. 2 is a diagram illustrating the imaging relationship between light beams from the mask alignment pattern 168a and the wafer alignment pattern 160a shown in FIG. 1.

In FIG. 2, a portion of the light beam emanating from the focal point 78 is diffracted by the mask alignment pattern 168a, and forms a focal point 78a indicating the mask position in the vicinity of the focal point 78. Another portion of the light beam passes through the mask 168 as a 0-order transmitted light beam, and is incident upon the wafer alignment pattern 160a on the surface of the wafer 160 without changing its wavefront. The light beam is then diffracted by the wafer alignment pattern 160a, then passes through the mask 168 as a 0-order transmitted light beam, and is focused in the vicinity of the focal point 78 to form a focal point 78b indicating the wafer position. In FIG. 2, when the light beam diffracted by the wafer 160 forms a focal point, the mask 168 merely passes the light beam therethrough.

The position of the focal point 78b provided by the wafer alignment pattern 160a in the above-described manner deviates by an amount of deviation $\Delta\sigma'$ from the focal point 78a, which corresponds to an amount of deviation $\Delta\sigma$ of the wafer 160 relative to the mask 168 in a direction along the surfaces of the mask and the wafer (lateral direction), in a direction along a plane orthogonal to an optical axis including the focal point 78.

FIG. 3 is a schematic diagram of an interval measuring apparatus proposed in Japanese Patent Laid-open Application (Kokai) No. 61-111402 (1986). In FIG. 3, a mask M, serving as a first object, is arranged to face a wafer W, serving as a second object, and a light beam is focused onto a point $P_S$, which is present between the mask M and the wafer W, by a lens L1.

At that time, the light beam is reflected by the surface of the mask M and the surface of the wafer W, and the reflected light beams are projected and focused onto points $P_M$ and $P_W$ on the surface of a screen S, respectively, by a lens L2. The interval between the mask M and the wafer W is measured by detecting the interval between the focal points $P_M$ and $P_W$ on the surface of the screen S.

The above-described position detection apparatus and interval measuring apparatus have entirely different configurations. Hence, in order to detect the relative positional relationship both in the facing direction of the first object (mask) and the second object (wafer) and in a direction perpendicular to that direction (the lateral direction or in-plane direction), the position detection apparatus and the interval measuring apparatus must be separately provided. As a result, the entire apparatus becomes large in size and complicated.

SUMMARY OF THE INVENTION

It is an object of the present invention to provide a position detection apparatus and a method for manufacturing semiconductor devices using the apparatus, in which when detecting the relative positional relationship between a first object and a second object in the direction of the interval therebetween and in the in-plane direction, a single apparatus can effectively detect relative misalignment between the two objects in the lateral direction and in the direction of the inverval between the surfaces of the objects, and in which the entire apparatus is small in size and simplified.

According to one aspect, the present inventions which achieves the above-described object, relates to a position detection apparatus for detecting the relative positional relationship between first and second objects facing each other in a facing directions comprising first, second and third marks, each serving as a physical optical element, provided on the first object, a fourth mark, serving as a physical optical element, provided on the second object, light projection means for projecting light onto the first object and the second object, and light detection means for detecting a first light beam diffracted by the first mark and reflected by the second objects for detecting a second light beam diffracted by the second mark and reflected by the second object, and for detecting a third light beam diffracted by the third mark and diffracted by the fourth mark. The relative relationship between the incident positions of the first and second light beams on a predetermined surface of the light detection means changes in accordance with the relative positional relationship between the first object and the second object in the facing direction, and the incident position of the third light beam on the predetermined surface and the interval between the position of the center of gravity of the third light beam on the predetermined surface and the midpoint of the interval between the positions of the centers of gravity of the first and second light beams on the predetermined surface changes in accordance with the relative positional relationship between the first object and the second object in a direction perpendicular to the facing direction. The apparatus further comprises first position detection means for detecting the relative positional relationship between the first object and the second object in the facing direction based on signals representing the first and second light beams from the light detection means, and second position detection means for detecting the relative positional relationship between the first object and the second object in a direction perpendicular to the facing direction based on the interval between the position of the center of gravity of the third light beam on the predetermined surface and the midpoint of the interval between the positions of the centers of gravity of the first and second light beams on the predetermined surface from the light detection means.

In one embodiment, the incident positions of the first, second and third light beams on the predetermined surface move in the same direction by the same amount on the predetermined surface in response to a change in the inclination of the second object with respect to the first object.

In another embodiment, the incident positions of the first and second light beams on the predetermined surface move in opposite directions on the predetermined surface in response to a change in the relative position between the first object and the second object in the facing direction.

In still another embodiment, the first position detection means comprises means for detecting the interval between the first and second light beams by detecting the positions of the centers of gravity of the first and second light beams on the predetermined surface.

In yet another embodiment, the second position detection means comprises means for detecting the interval between the midpoint of the incident positions of the first and second light beams on the predetermined surface and the incident position of the third light beam on the predetermined surface.

In yet a further embodiment, at least one of the first, second, third and fourth marks comprises a grating lens, a Fresnel zone plate, or a diffraction grating which does not have a lens function.

According to another aspect, the present invention relates to a position detection method for detecting the relative positional relationship between first and second objects facing each other in a facing direction, comprising the steps of providing first, second and third marks, each serving as a physical optical element, on the first object, providing a fourth mark, serving as a physical optical element, on the second object, projecting light onto the first object and the second object, and detecting a first light beam diffracted by the first mark and reflected by the second object, detecting a second light beam diffracted by the second mark and reflected by the second object, and detecting a third light beam diffracted by the third mark and diffracted by the fourth mark. The relative relationship between the incident positions of the first and second light beams on a predetermined surface of light detection means changes in accordance with the relative positional relationship between the first object and the second object in the facing direction, and the incident position of the third light beam on the predetermined surface and the interval between the position of the center of gravity of the third light beam on the predetermined surface and the midpoint of the interval between the positions of the centers of gravity of the first and second light beams on the predetermined surface changes in accordance with the relative positional relationship between the first object and the second object in a direction perpendicular to the facing direction. The method further comprises the steps of detecting the relative positional relationship between the first object and the second object in the facing direction based on signals representing the first and second light beams generated in response to the detecting in the light detecting step, and second position detection means for detecting relative positional relationship between the first object and the second object in a direction perpendicular to the facing direction based on the interval between the position of the center of gravity of the third light beam on the predetermined surface and the midpoint of the interval between the positions of the centers of gravity of the first and second light beams on the predetermined surface generated in response to the detecting in the light detecting step.

According to still another aspect, the present invention relates to an exposure apparatus for detecting the positions of marks formed on a wafer, and for transferring a pattern on a mask onto the wafer, which face each other in a facing direction, the apparatus comprising a movable stage for mounting the wafer, first, second and third marks, each serving as a physical optical element, provided on the mask, a fourth mark, serving as a physical optical element, provided on the wafer, light projection means for projecting light onto the mask and the wafer, and light detection means for detecting a first light beam diffracted by the first mark and reflected by the wafer, for detecting a second light beam diffracted by the second mark and reflected by the wafer, and for detecting a third light beam diffracted by the third mark and diffracted by the fourth mark. The relative relationship between the incident positions of the first and second light beams on a predetermined surface of the light detection means changes in accordance with the relative positional relationship between the mask and the wafer in the facing direction, and the incident position of the third light beam on the predetermined surface and the interval between the position of the center of gravity of the third light beam on the predetermined surface and the mid-point of the interval between the positions of the centers of gravity of the first and second light beams on the predetermined surface changes in accordance with the relative positional relationship between the mask and the wafer in a direction perpendicular to the facing direction. The apparatus further comprises first position detection means for detecting the relative positional relationship between the mask and the wafer in the facing direction based on signals representing the first and second light beams from the light detection means, second position detection means for detecting the relative positional relationship between the mask and the wafer in a direction perpendicular to the facing direction based on the interval between the position of the center of gravity of the third light beam on the predetermined surface and the midpoint of the interval between the positions of the centers of gravity of the first and second light beams on the predetermined surface from the light detection means, and a control system for causing the wafer to be moved by the movable stage based on the position of the wafer with respect to the mask obtained from the first and second position detection means, and for transferring the pattern on the mask onto the wafer.

According to yet another aspect, the present invention relates to a method for manufacturing semiconductor devices by detecting the positions of marks formed on a wafer, and for transferring a pattern on a mask onto the wafer facing the mask in a facing direction, comprising the steps of providing first, second and third marks, each serving as a physical optical element, on the mask, providing a fourth mark, serving as a physical optical element, on the wafer, projecting light onto the mask and the wafer, and detecting a first light beam diffracted by the first mark and reflected by the wafer, detecting a second light beam diffracted by the second mark and reflected by the wafer, and a detecting third light beam diffracted by the third mark and diffracted by the fourth mark. The relative relationship between the incident positions of the first and second light beams on a predetermined surface changes in accordance with the relative positional relationship between the mask and the wafer in the facing direction, and the incident position of the third light beam on the predetermined surface and the interval between the position of the center of gravity of the third light beam on the predetermined surface and the midpoint of the interval between the positions of the centers of gravity of the first and second light beams on the predetermined surface changes in accordance with the relative positional relationship between the mask and the wafer in a direction perpendicular to the facing direction. The method further comprises the steps of detecting the relative positional relationship between the mask and the wafer in the facing direction based on signals representing the first and second light beams generated in response to the detecting in the light detecting step, detecting the relative positional relationship between the mask and the wafer in a direction perpendicular to the facing direction based on the interval between the position of the center of gravity of the third light beam on the predetermined surface and the midpoint of the interval between the positions of the centers of gravity of the first and second light beams on the predetermined surface generated in response to the detecting in the light detecting step, and moving the wafer based on the position of the wafer with respect to the mask obtained from the first and second position detecting steps, and transferring the pattern on the mask onto the wafer.

The foregoing and other objects, advantages and features of the present invention will become more apparent from the following description of the preferred embodiments taken in conjunction with the accompanying drawings.

DESCRIPTION OF THE PREFERRED EMBODIMENTS

Figure 1:
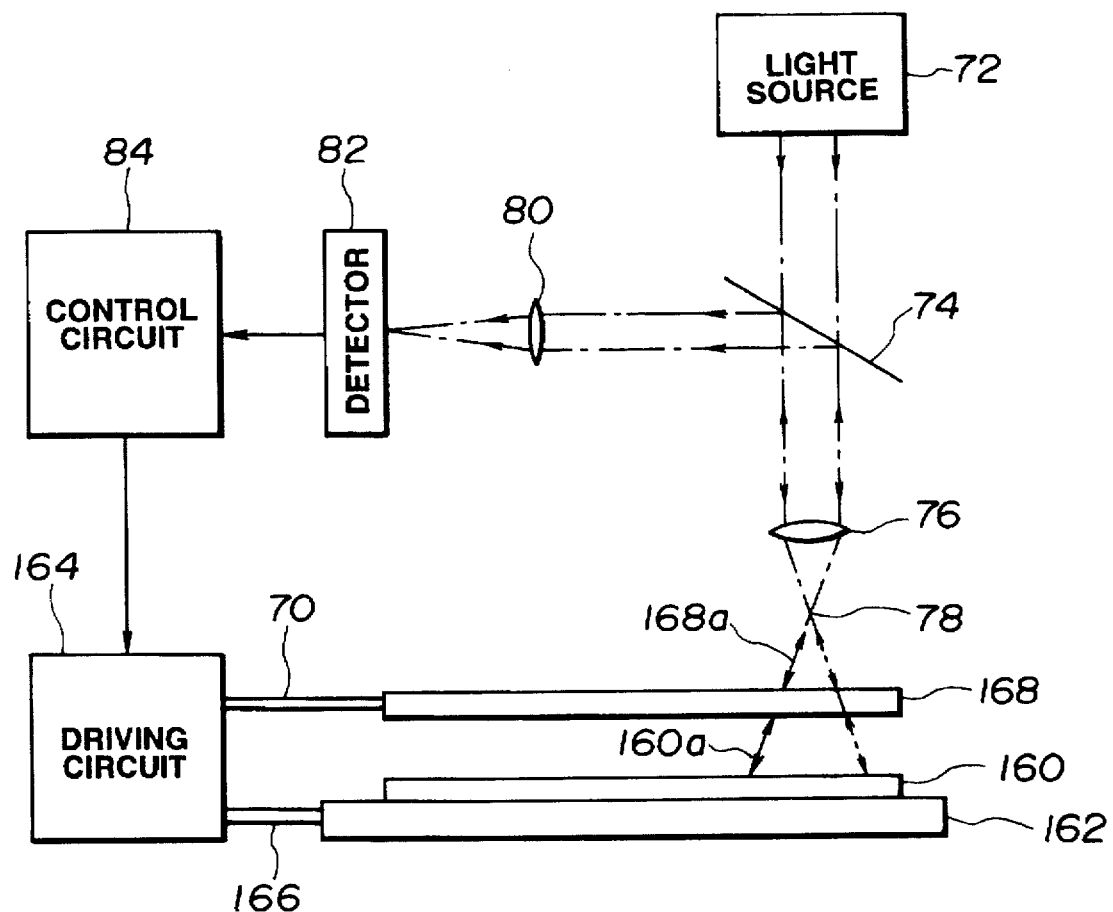
FIG. 1 is a schematic diagram illustrating a principal portion of a conventional position detection apparatus.
Figure 2:
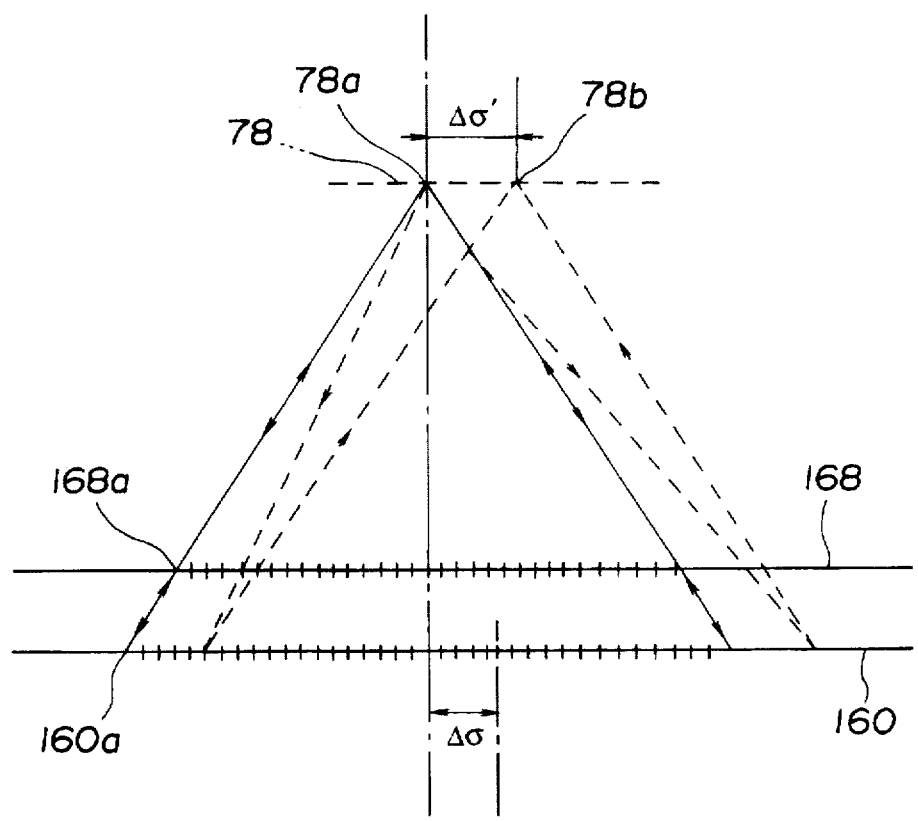
FIG. 2 is a diagram illustrating a portion of FIG. 1.
Figure 3:
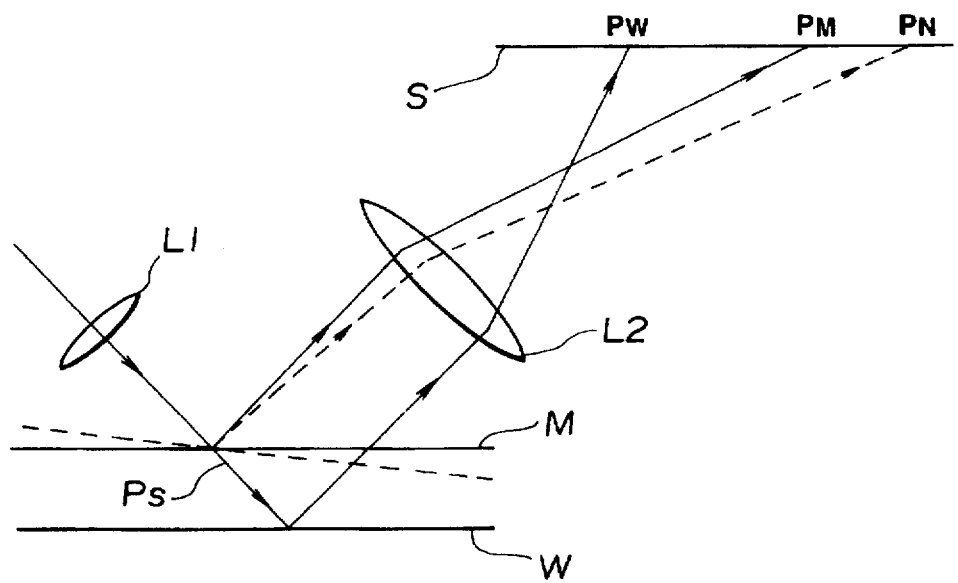
FIG. 3 is a schematic diagram illustrating a principal portion of a conventional interplane-interval detection apparatus.
Figure 4:
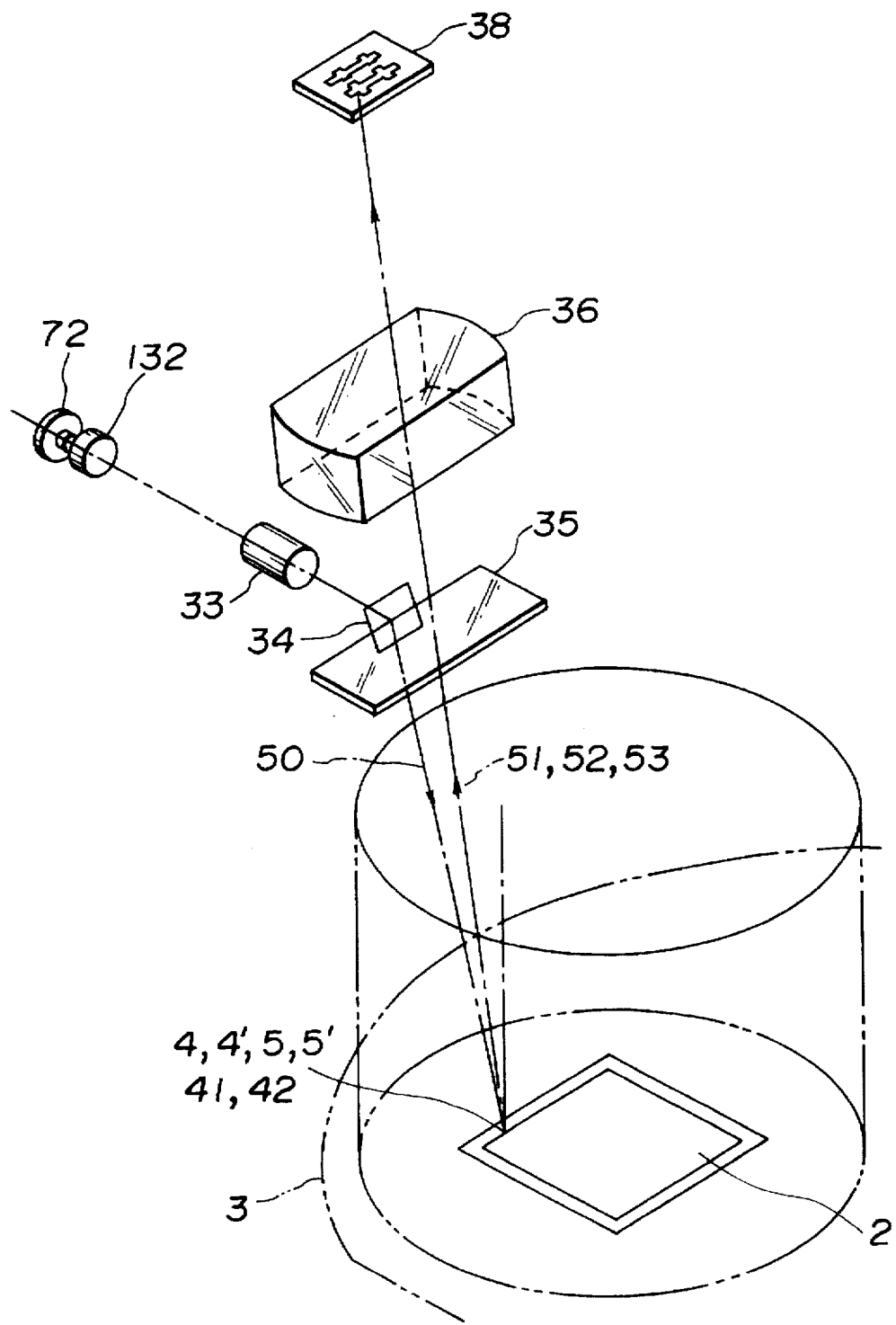
FIG. 4 is a schematic diagram illustrating a principal portion of a position detection apparatus according to a first embodiment of the present invention.
Figure 5:
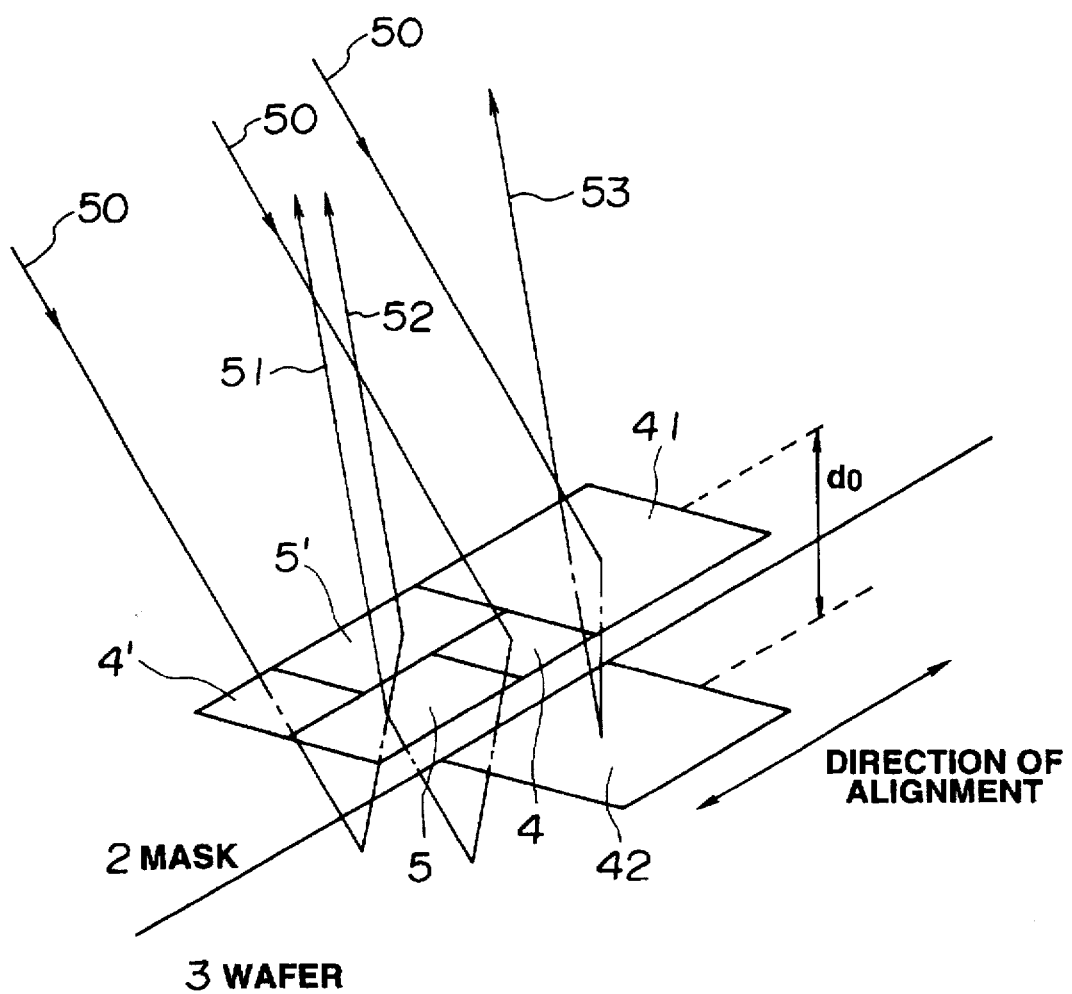
FIG. 5 is an enlarged view illustrating a portion of FIG. 4.
Figure 6:
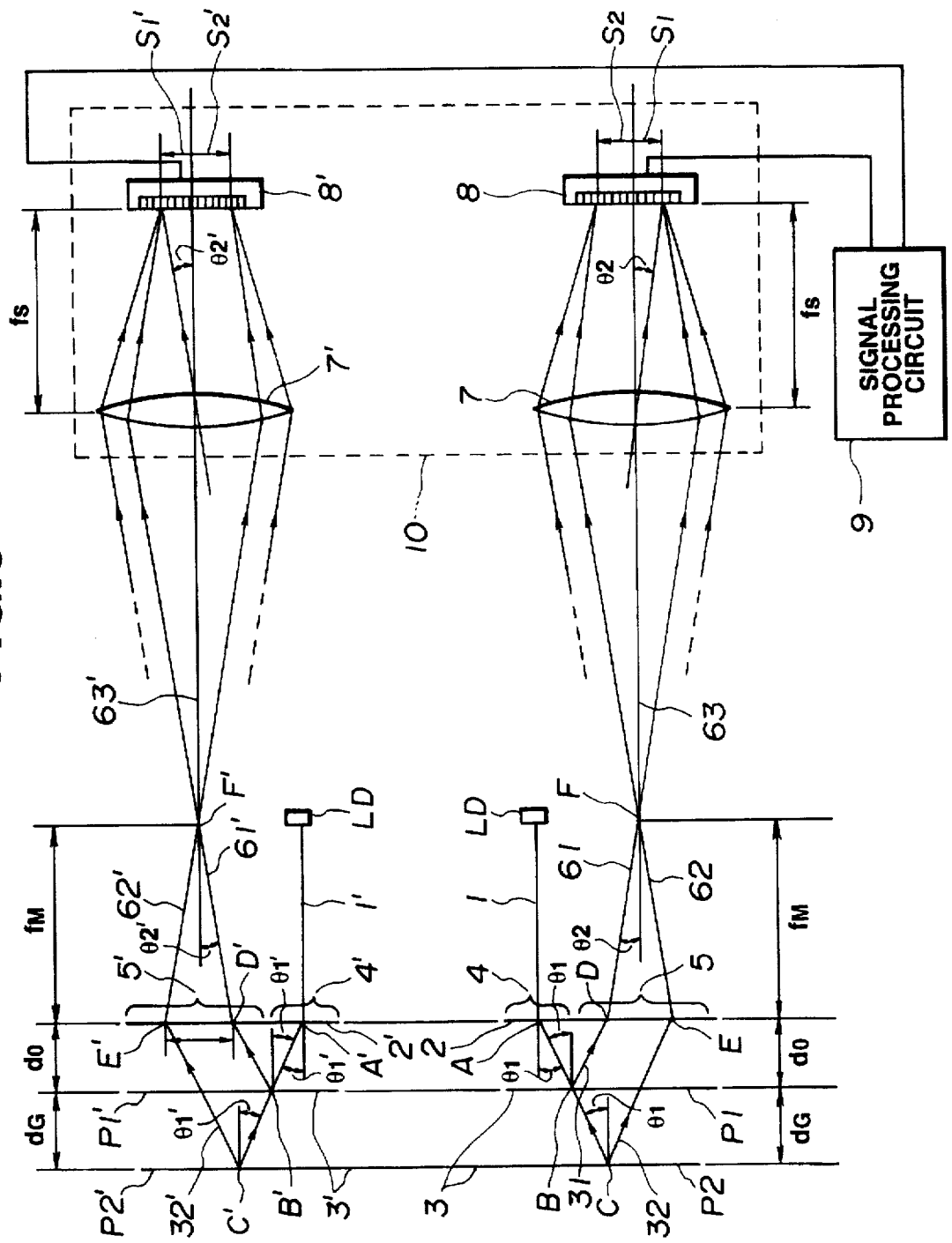
FIGS. 6 and 7 are schematic diagrams illustrating an interplane-interval detection system of the first embodiment.
Figure 7:
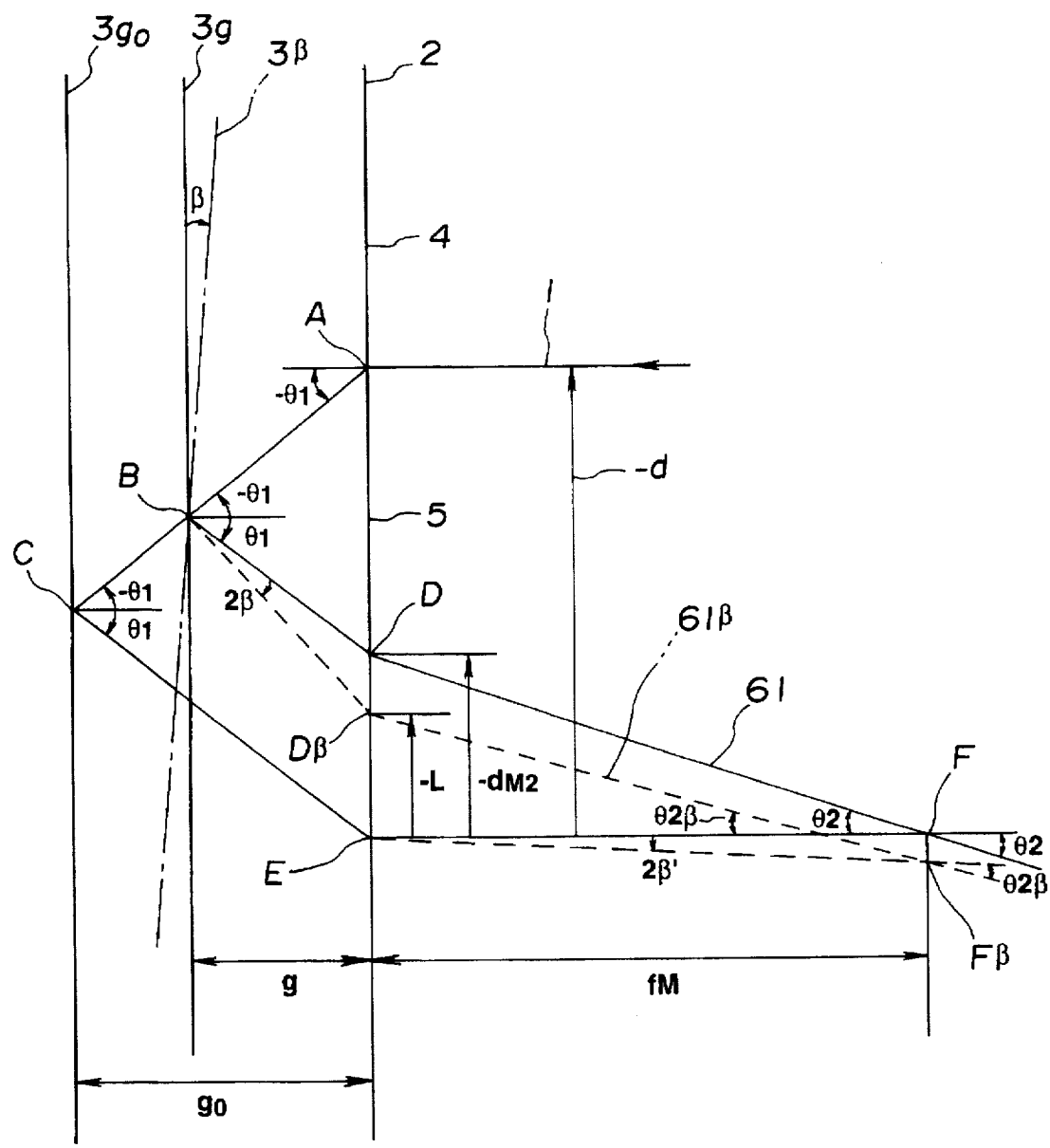
Figure 8:
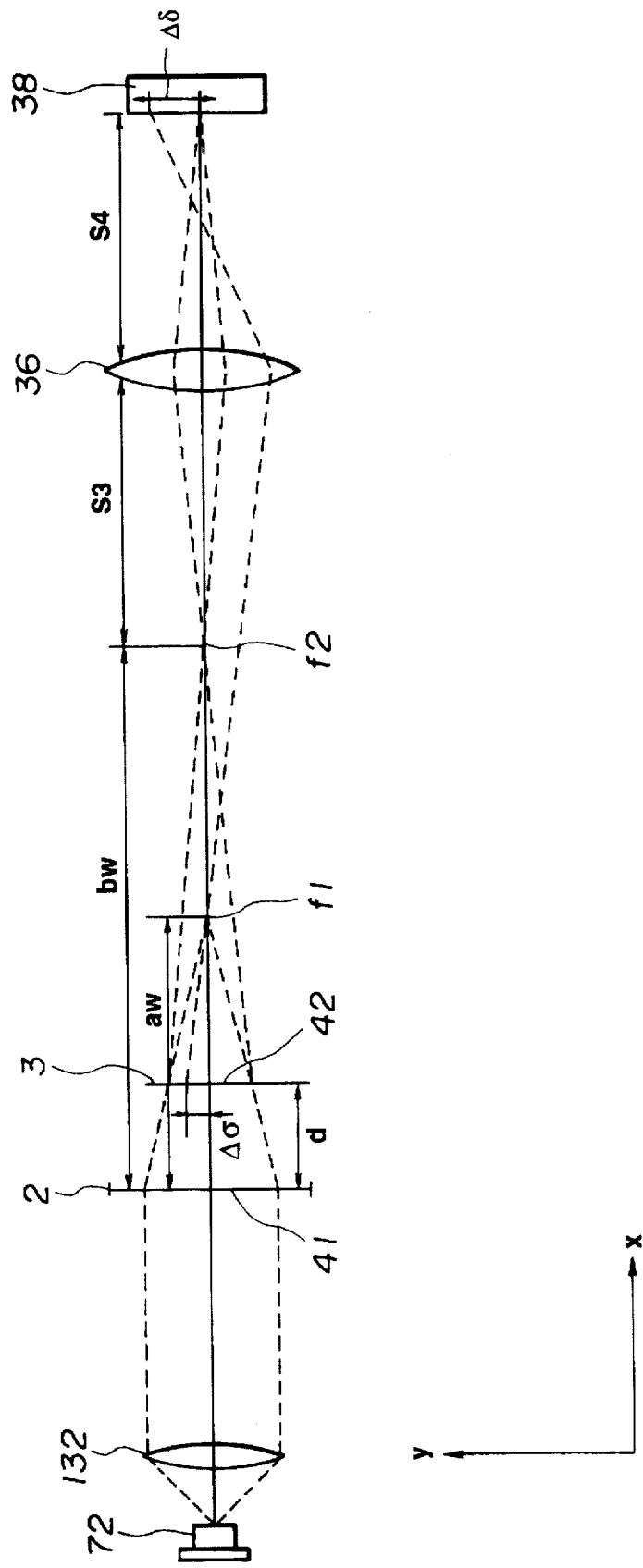
FIG. 8 is a schematic diagram illustrating a surface-position-deviation detection system of the first embodiment.
Figure 9:
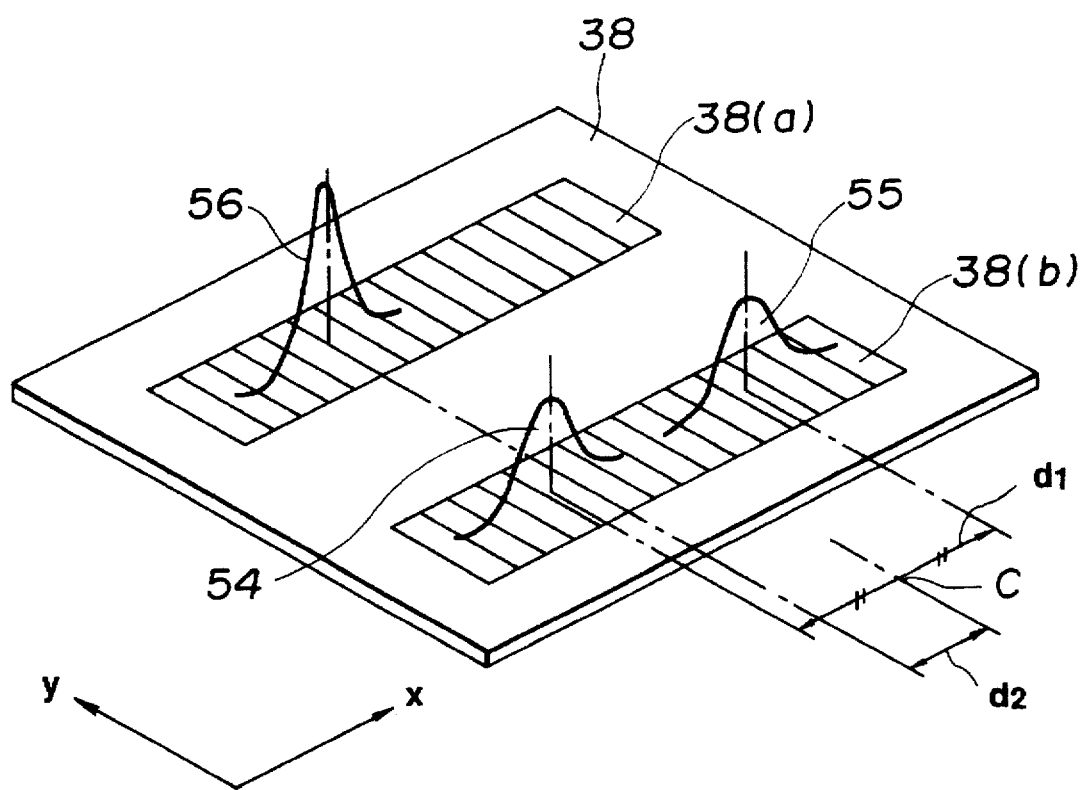
FIG. 9 is a schematic diagram illustrating incident light beams on the surface of light detection means shown in FIG. 4.

FIG. 4 is a perspective view of a principal portion of a first embodiment of the present invention. FIG. 5 is an enlarged view illustrating a portion of FIG. 4. FIGS. 6 and 7 are diagrams illustrating the principle of interval detection means when the interval between a first object and a second object is detected in the present embodiment. FIG. 8 is a diagram illustrating the principle of position detection means when deviation (lateral deviation) between the first object and the second object in the direction of the surfaces is detected. FIG. 9 is a diagram illustrating spots on the surface of a sensor 38 shown in FIG. 4.

The present embodiment is applied to a proximity-type exposure apparatus for manufacturing semiconductor devices.

In FIGS. 4 and 6, an electronic-circuit pattern is formed on the surface of a mask 2, serving as a first object. A wafer 3 serves as a second object. Each of alignment marks 4, 4', 5, 5' and 41 comprises a physical optical element formed on the surface of the mask 2. An alignment mark 42 comprises a physical optical element formed on the surface of the wafer 3. The physical optical elements 4, 4', 5 and 5' are alignment marks (AF marks) for detecting the interval between the mask 2 and the wafer 3, and physical optical elements 41 and 42 are alignment marks (AA marks) for detecting the in-plane directions of the mask 2 and the wafer 3, i.e., for detecting so-called lateral deviation.

The physical optical element in the present embodiment comprises a grating lens or a Fresnel zone plate functioning as a one-dimensional or two-dimensional lens, a diffraction grating which does not have a lens function, or the like.

In FIG. 4, a laser light source 72 emits a coherent light beam 50 having excellent directivity. Reference numeral 132 represents a collimating lens. A projection lens 33 projects the light beam 50 from the laser light source 72, passing through the collimating lens 132, onto the alignment marks on the surface of the mask 2 via a mirror 34 and a filter 35. A detection unit 38 comprises a line sensor, such as a CCD (charge-coupled device) or the like. A light-receiving lens 36 condenses light beams 51, 52 and 53 from the side of the surface of the mask 2, and guides these light beams to the detection unit 38.

In FIG. 5, the light beam 50 is diffracted by the first physical optical element 4 (4') on the surface of the mask 2, is reflected by the wafer 3, and is diffracted by the second physical optical element 5 (5') on the surface of the mask 2, to become the light beam 51 (62). The light beam 50 is also subjected to optical interactions by the physical optical element 41 on the surface of the mask 2 and the physical optical element 42 on the surface of the wafer 3, to become the light beam 53. The mask 2 and the wafer 3 are separated by a distance or interval $d_0$.

First, a description will be provided of the principle of detecting the interval between the mask 2 and the wafer 3 in the present embodiment, with reference to FIGS. 6 and 7. In FIG. 6, optical paths of two systems from light sources LD to two photosensing means 8 and 8' are illustrated separately, in order to facilitate understanding.

In FIG. 6, there are shown light beams 1 and 1' from the light sources LD, each comprising a He—Ne laser, a semiconductor laser or the like, first objects 2 and 2', such as masks, and second objects 3 and 3' such as wafers. As shown in FIG. 5, the mask 2 and the wafer 3 are arranged so as to face each other with an interval do therebetween. There are also shown first physical optical elements 4 and 4' and second physical optical elements (AF marks) 5 and 5' provided on portions of the surfaces of the masks 2 and 2', respectively. Condenser lenses 7 and 7' have a focal length of fs.

The photosensing means (sensors) 8 and 8' are disposed at the positions of the loci of the condenser lenses 7 and 7', respectively. Each of the photosensing means 8 and 8' comprises a line sensor, a PSD (photosensing diode) or the like, and detects the position of the center of gravity of the incident light beam within the surface of the photosensing means. The center of gravity of the light beam is a point where, when integrating each value obtained by multiplying the position vector of each point from that point within a cross section of the incident light beam by the light intensity at each point within the entire cross section, the integral value becomes a 0 vector. Alternatively, a position where the light intensity has a peak value may be detected.

A signal processing circuit 9 obtains the position of the center of gravity of each of light beams incident upon the photosensing means 8 and 8' using signals from the photosensing means 8 and 8', respectively, and calculates the interval $d_0$ between the mask 2 and the wafer 3, as will be described later. An optical pickup 10 includes the condenser lens 7 and the photosensing means 8, and the signal processing circuit 9 whenever necessary, and can be moved relative to the mask 2 and the wafer 3. The optical pickup 10 also includes the condenser lens 7' and the photosensing means 8'.

The two systems, i.e., upper and lower systems, shown in FIG. 6 constitute systems symmetrical with respect to a line 63 present at the same distance from the optical axes of the light-projecting systems of the two systems on the plane of FIG. 6. Since the two systems have substantially the same configuration in the present embodiment, only the lower system shown in FIG. 6 will now be described in detail.

In the present embodiment, the light beam 1 (having a wavelength of λ=830 nm) from the semiconductor laser LD is projected perpendicularly onto a point A on the surface of the first physical optical element (hereinafter abbreviated as the "first FZP") 4 on the surface of the mask 2. A diffracted light beam of a predetermined order diffracted by the first FZP 4 at an angle $\theta_1$ is reflected to a point B (C) on the surface of the wafer 3. Reference numeral 31 represents a reflected light beam reflected by the wafer 3 when the wafer 3 is positioned at a position P1 which is close to the mask 2. Reference numeral 32 represents a reflected light beam reflected by the wafer 3 when the wafer 3 is positioned at a position P2 displaced from the position P1 by a distance $d_G$.

Thereafter, the reflected light beam from the wafer 3 is projected onto a point D (a point E for the position P2) on the surface of the second physical optical element (hereinafter referred to as the "second FZP") 5 on the surface of the first object 2. The second FZP 5 has the optical function of changing the angle of the emanating diffracted light beam in accordance with the position of the incident light beam. A diffracted light beam 61 (62 for the position P2) of a predetermined order diffracted by the second FZP 5 at an angle $\theta_2$ is guided onto the surface of the photosensing means 8 via the condenser lens 7 at a point within the range S1 (diffracted light beam 62 is guided onto the surface of the photosensing means 8 via the condenser lens 7 at a point within the range S2). The interval between the mask 2 and the wafer 3 is calcuated using the position of the center of gravity of the diffracted light beam 61 (62 for the position P2) on the photosensing means 8.

In the present embodiment, the first FZP 4 and the second FZP 5 provided on the surface of the mask 2 have a known pitch, and the angle of diffraction $\theta_1$ on the first FZP 4 and the angle of diffraction $\theta_2$ at a predetermined incident position on the second FZP 5 of diffracted light beams of a predetermined order (for example, ±1st order) of light beams incident upon the first FZP 4 and the second FZP 5, respectively, are previously obtained.

Next, a description will be provided of a method for obtaining the interval between the mask 2 and the wafer 3 with reference to the diagram of the optical path shown in FIG. 7.

In FIG. 7, the light beam 1 is projected onto the first FZP 4 at the incident side on the mask 2, and is diffracted in the direction of $-\theta_1$ at a point A. When a wafer $3g_0$ is present at a position separated by a gap $g_0$ from the mask 2, the respective components are arranged so that the above-described diffracted light beam is reflected at a point C, is again diffracted at a point E on the second FZP at the outgoing side on the surface of the mask 2, and proceeds in the direction of the optical axis of the light-receiving system. That is, an interval –d from the point E to the point A is set so that the diffracted light beam passes through a point F at a distance $f_M$ from the wafer 2.

When the gap between the mask 2 and the wafer 3 has an arbitrary value g, the diffracted light beam is reflected at a point B, and is then diffracted so as to pass through a point D on the second FZP 5 and reach the point F as a light beam 61. If it is assumed that the wafer 3g is tilted at the point B by an angle β, i.e., the wafer 3β, and that the light beam is reflected at the point B, is diffracted at a point $D_\beta$ on the second FZD 5, and reaches a point $F_\beta$ as a diffracted light beam 61β, the following expressions hold, and an angle $\theta_{2\beta}$ made by the light beam emanating from the second FZP 5 and the optical axis of the light-receiving system is determined by the gaps $g_0$ and g, the outgoing angle $-\theta_1$ with respect to the first FZP 4 at the incident side, the focal length $f_M$ of the second FZD 5 at the emanating side, and the tilting angle $\beta$ of the wafer 3g.

If the directions of the angles and the lengths are defined as shown in FIG. 7, $$\overline{F\beta F} + \overline{ED\beta} = -f_M \tan \theta_2\beta = L - f_M \tan 2\beta' \quad (1)$$

$$\overline{D\beta D} = d_{M2} - L = -\{g \tan (\theta_1 + 2\beta) - g \tan \theta_1\} \quad (2)$$

where L is the distance from point $D_\beta$ to point E, $\theta_1$ is the angle light reflected from points B and C makes with a horizontal axis, $2\beta$ is the angle of the light beam reflected at point B, when the wafer is tilted at angle $\beta$, with respect to a light beam reflected at point B when the wafer is not tilted, $2\beta'$ is the angle the light beam diffracted at point E makes with a horizontal axis when the wafer is tilted at an angle $\beta$, and $\theta_2$ is the angle the light beam diffracted at point D makes with a horizontal axis.

A change in the outgoing angle at the point E due to the tilting is:

$$2\beta' = \cos \theta_1 2\beta \quad (3)$$

Since $d = -2g_0 \tan \theta_1$, $$d_{M2} = d + 2g \tan \theta_1 = 2(g - g_0) \tan \theta_1 \quad (4)$$

The value of $\tan \theta_{2\beta}$ is obtained from the above-described expressions (1) through (4) as:

$$\tan \theta_{2\beta} = -1/f_M[\{2(g-g_0) \tan \theta_1 + g \{\tan (\theta_1+2\beta) - \tan \theta_1\} - f_M \tan (2\beta \cos \theta_1)\}] \quad (5)$$

If the displacement of the spot on the surface of the sensor 8 caused by movement of the light beam 61 due to tilting of the wafer is represented by $S_1$, $$S_1 = f_S \tan \theta_2 \beta \quad (6)$$

$$= -2f_S/f_M(g - g_0)\tan\theta_1 + \beta\{g(1 + \tan^2\theta_1) - f_M\cos\theta_1\}]$$

where it is assumed that $\beta << 1$, and $\tan (C\beta) \approx C\beta$.

From expression (6), if there is no tilting of the wafer 3g, the movement of the spot $S_1$ is $$S_1 = 2f_s/f_M\Delta g \tan \theta_1 \quad (6)'$$

where $\Delta g = g_0 - g$, so that the spot moves on the surface of the photosensing means 8 with a $2fs/f_M \tan \theta_1$ multiple of the amount of change of the gap $\Delta g$.

Similarly, if the movement of the spot on the sensor 8' by the system shown in FIG. 6 is represented by $S_1'$, $$S_1' = -2fs/f_M\Delta g \tan \theta_1 \quad (7)$$

and the amount of change of the spot $\Delta S$ on the surface of the photosensing means 8' with respect to the amount of change of the gap is expressed by:

$$\Delta S = S_1 - S_1' = 4fs/f_M\Delta g \tan \theta_1 \quad (8)$$

where $\Delta g = g_0 - g$.

The difference between the amounts of deviation of the respective positions of the centers of gravity from the reference positions obtained in the above-described manner for the sensors 8 and 8' is substituted for the amount of change $\Delta S$ in this case, and the interval is obtained. For example, if it is assumed that $f_S$=30 mm, $f_M$=1 mm, and $\tan \theta_1$=1, $\Delta S/\Delta g$=120, so that theoretically, it is possible to measure the interval between the mask 2 and the wafer 3 with a resolution of 0.0025 μm.

As proposed in Japanese Patent Laid-open Application (Kokai) No. 2-167413 (1990), the influence by the tilting of the wafer $\beta$ (the amount the error gap $\epsilon'g$) is sufficiently small and is therefore negligible. The difference between the amounts of movement of spots in the above-described two optical systems corresponds to a change in the interval between the mask and the wafer, and is little influenced by the tilting of the wafer. Hence, in the present embodiment, by obtaining the difference between the amounts of movement of the spots, a change in the gap is very precisely measured.

Next, a description will be provided of a measuring method for detecting the amount of deviation in a direction perpendicular to the facing direction of the mask 2 and the wafer 3 (the amount of lateral deviation), with reference to FIG. 8.

In FIG. 8, a light beam from a light source 72, such as a He—Ne laser, an LD (laser diode) or the like, becomes a parallel light beam via a collimating lens 132, and is imaged onto a sensor 38 by a lens 38 via the physical optical element (AA mark) 41 on the mask 2 and the physical optical element (AA mark) 42 on the wafer 3. Although in FIG. 8, for the convenience of explanation, both the physical optical elements 41 and 42 are illustrated as transparent type elements, the physical optical element 42 is actually a reflection type element.

If a deviation of $\Delta\sigma$ from a reference position in the y direction (the direction of lateral deviation) is produced between the mask 2 and the wafer 3, the imaging position of the light beam from the light source 72 on the photosensing surface of the sensor 38 is displaced by $\Delta\delta$ in accordance with the amount of deviation $\Delta\sigma$. If the interval between the mask 2 and the wafer 3 is represented by d, the distance between the mask 2 and a point f1 (corresponding to the focal length of the physical optical element 41 assuming that it comprises a convex lens) is represented by aw, and the distance between a focus position f2 after passing through the physical optical elements 41 and 42 (the physical optical element 42 functions as a concave lens) and the mask 2 is represented by bw, the amount of deviation $\Delta\delta$ is expressed by:

$$\Delta\delta = \{1 - bw/(aw-d)\} \cdot \Delta\sigma \cdot (-s3/s4) \quad (9)$$

where s3 is the object distance of the lens 36, and s4 is the image distance of the lens 36. If the interval d between the mask 2 and the wafer 3 is 30 μm, the focal length aw of the physical optical element 41 is 214.7 μm, the distance bw between the mask 2 and the point f2 is 18.7 mm, and the lens 36 comprises an imaging lens having unit magnification, expression (9) becomes:

$$\Delta\delta = -100 \cdot \Delta\sigma \quad (10)$$

Hence, the position of the center of gravity of the beam spot on the sensor 38 changes with a sensitivity of 100 times with respect to the amount of lateral deviation $\Delta\sigma$ between the mask 2 and the wafer 3. If the resolution of the sensor 38 is assumed to be 0.1 μm, the amount of lateral deviation $\Delta\sigma$ has a positional resolution of 0.001 μm.

Next, a description will be provided of a method of obtaining the amount of lateral deviation between the mask 2 and the wafer 3 with reference to FIG. 9. FIG. 9 is an enlarged view of the photosensing surface of the sensor 38. The sensor 38 has photosensing surfaces 38(a) and 38(b). The beam spot 86 of the diffracted light beam 53 (see FIG.

5) is imaged on the photosensing surface 38(a), and the beam spots 54 and 55 of the diffracted light beams S1 and 52 (see FIG. 5), respectively, are imaged on the photosensing surface 38(b). First, the midpoint c of the interval $d_1$ between the positions of the centers of gravity (or the positions of the peak amounts of light) of the beam spots 54 and 55 is obtained. Next, the interval $d_2$ between the position of the center of gravity (or the position of the peak amount of light) of the beam spot 56 and the point c is obtained. This interval $d_2$ is a measured value corresponding to the amount of lateral deviation between the mask 2 and the wafer 3.

It is known from simulation that if the wafer 3 is tilted, the positions of the centers of gravity of the beam spots 54, 55 and 56 move in the same direction by the same amount. If the midpoint c of the beam spots 54 and 56 for measuring the gap is utilized as a reference point when obtaining the amount of lateral deviation between the mask 2 and the wafer 3, the position of the reference point is invariable irrespective of deviations in the gap. Hence, stable measurement can be performed. Although in the present embodiment the midpoint of the interval $d_1$ is utilized, a point dividing the interval $d_1$ with a ratio of m:n may also be used.

As described above, in the present embodiment, the interval and lateral deviation between the mask 2 and the wafer 3 are measured, and alignment between the mask 2 and the wafer 3 is performed based on the results of the measurement.

Figure 10:
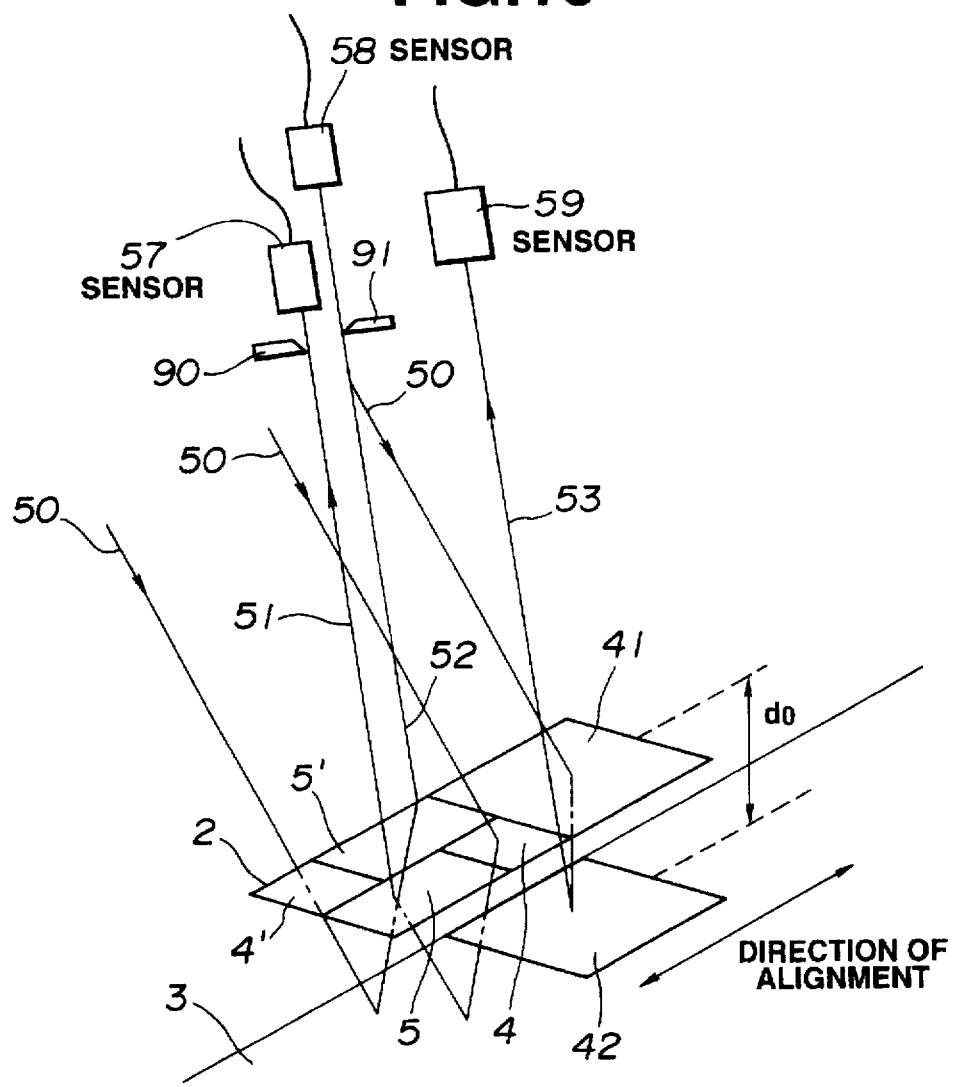
FIG. 10 is a schematic diagram illustrating a principal portion of a position detection system according to a second embodiment of the present invention.

FIG. 10 is a schematic diagram illustrating a principal portion of a second embodiment of the present invention. In this embodiment the same reference numerals as those used in the first embodiment refer to the same or similar elements.

The present embodiment differs from the first embodiment in that in order to measure the interval between the mask 2 and the wafer 3, a change in the amount of diffracted light is detected and measured instead of measuring a change in the position of the center of gravity of the beam spot of diffracted light as in the first embodiment. The configuration of the present embodiment is substantially the same as that of the first embodiment in other respects.

In FIG. 10, the illuminating light beam 50 from the light source is projected onto the physical optical elements 4, 4', 5, 5', and 41 on the mask 2 and the physical optical element 42 on the wafer 3 (having the same power arrangement as in the first embodiment), and the diffracted light beams 51, 52 and 53 are obtained from the corresponding physical optical elements as in the first embodiment.

In the present embodiment, as shown in FIG. 10, the diffracted light beams 51, 52 and 53 are imaged by imaging lenses (not shown) onto sensors 57, 58 and 59, respectively. The diffracted light beams 51 and 52 are imaged onto the sensors 57 and 58 in a state in which portions of the light beams are cut by knife edges 90 and 91, respectively. Each of the sensors 57 and 58 comprises a sensor for detecting the amount of light incident thereon.

Figure 11A:
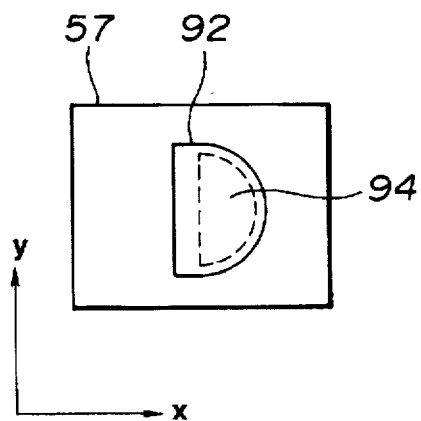
FIGS. 11(a) and 11(b) are schematic diagrams illustrating incident light beams on the surface of light detection means shown in FIG. 10.
Figure 11B:
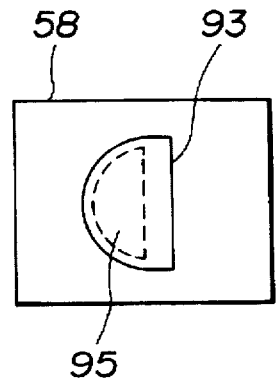
Figure 12:
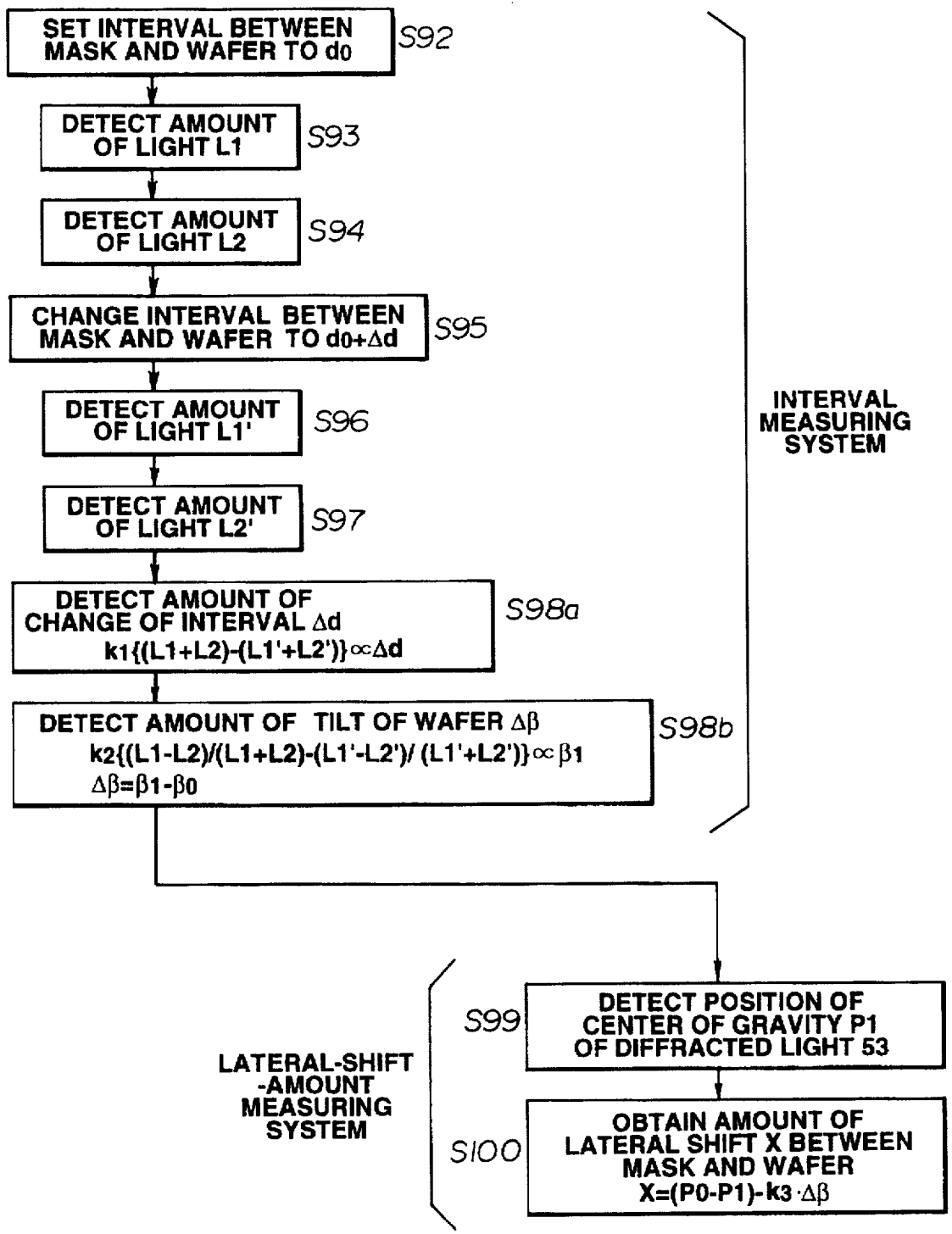
FIG. 12 is a flowchart of the interval detection method in the second embodiment.

FIGS. 11(a) and 11(b) are diagrams illustrating a state in which the diffracted light beams 51 and 52 are projected onto the surfaces of the sensors 57 and 58, respectively. FIG. 12 is a flowchart describing a method of performing interval detection in the present embodiment.

Next, a description will be provided of a method of detecting the interval between the mask 2 and the wafer 3 by measuring changes in the amounts of light on the surfaces of the sensors 57 and 58 with reference to FIGS. 11(a), 11(b) and 12.

In FIG. 11(a), the beam spot 92 of the diffracted light beam 51 is formed on the photosensing surface of the sensor 57, and in FIG. 11(b) the beam spot 93 of the diffracted light beam 52 is formed on the photosensing surface of the sensor 58. The beam spots 92 and 93 are not circular because portions of the diffracted light beams 51 and 52 are cut by the knife edges 90 and 91, respectively. The sensors 57 and 58 output signals representing the amounts of light in accordance with the shapes of the beam spots. The output values from the sensors 57 and 58 when the interval between the mask 2 and the wafer 3 equals do are represented by L1 and L2, respectively.

If the interval between the mask 2 and the wafer 3 changes by Δd, the optical paths of the diffracted light beams 51 and 52 change, so that the relative positions of the knife edges 90 and 91 change, and the shapes of the beam spots on the sensors 57 and 58 also change.

Reference numerals 94 and 95 represent beam spots on the sensors 57 and 58 at that time, respectively. The output values from the sensors 57 and 58 are represented by L1' and L2', respectively, when the interval between the mask 2 and the wafer 3 changes by Δd. Changes in the amounts of light are measured from the output values L1 and L2 of the sensors when the interval between the mask 2 and the wafer 3 equals $d_0$, and the output values L1' and L2' of the sensors when the interval becomes $d_0$+d. The measured values are compared with data of the amounts of change in the interval between the mask 2 and the wafer 3 for changes in the amounts of light which have previously been measured, and the interval between the mask 2 and the wafer 3 is measured based on the results of the comparison.

The amount of the tilting Δβ of the wafer 3 is calculated from these changes in the amounts of light, and the amount of lateral deviation X between the mask 2 and the wafer 3 is obtained from the position of the center of gravity of the diffracted light beam 53 obtained from the sensor 59.

FIG. 12 is a flowchart of a method of obtaining the measured values of the interval and lateral deviation. In FIG. 12, at the starting point of measurement in step S92, the interval do between the mask 2 and the wafer 3 is set and the amount of the tilting $β_0$ of the wafer 3 is measured by a measuring apparatus having guaranteed accuracy, and therefore the initial values of these values are known. Next, the amount of light L1 measured by sensor 57 is detected in step S93 and the amount of light L2 measured by sensor 58 is detected in step S94. Then, the interval between the mask 2 and the wafer 3 is changed from $d_0$ to $d_0$+Δd in step S95. Next, the sensor 57 detects the amount of light L1' in step S96, while the sensor 58 detects the amount of light L2' in step S97. The value of the position of the center of gravity P0 of the spot beam of the diffracted light beam 53 at a desired interval between the mask 2 and the wafer 3 is determined and no lateral deviation is obtained from actual exposure and printing. Accordingly, the interval and the amount of deviation to be detected are relative amounts of deviation from the initial values.

In FIG. 12, k1, k2 and k3 represent coefficients obtained from experiments or the like. In step S98a, the amount of change in the interval between the mask and the wafer, Δd, is detected based on the amounts of light detected by the sensors 57 and 58 when the interval between the mask 2 and the wafer 3 equals $d_0$ before the change, and d0+Δd after the change. In step S98b, the amount of the tilting, Δβ, of the wafer 3 is detected. The amount of tilting Δβ equals the amount of tilting $β_1$, after a change in the amount of tilting from an initial value $β_0$, minus the amount of tilting $β_0$. Next, step S99 detects the position of the center of gravity P1, after the interval has changed by Δd and the amount of tilt has changed by Δβ, of the diffracted light beam 53. Then, the amount of lateral deviation or shift, X, is obtained in step S100, between the mask 2 and the wafer 3 via the formula $X=(P0-P1)-k3\cdot\Delta\beta$.

Figure 13:
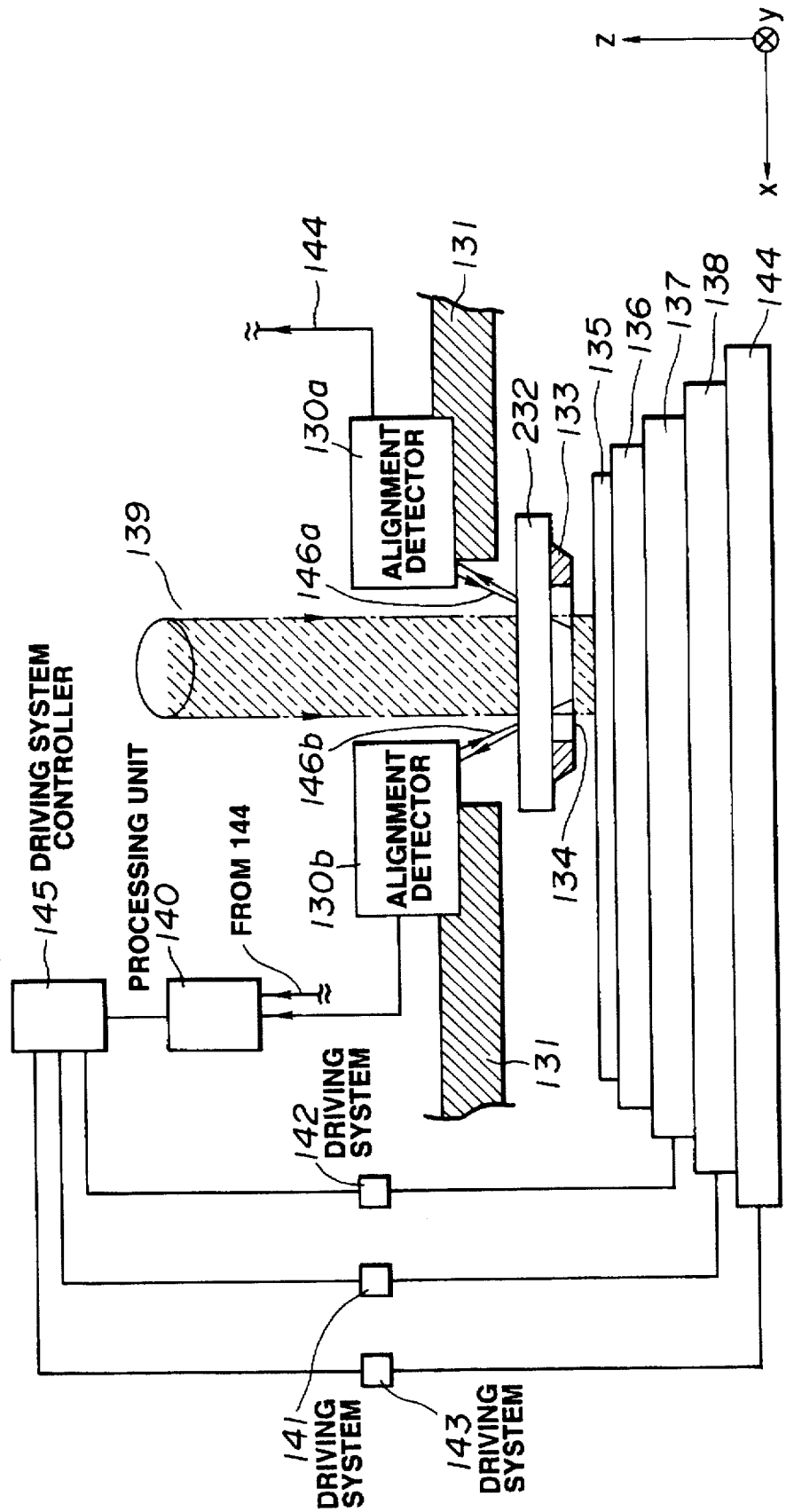
FIG. 13 is a schematic diagram illustrating a principal portion when the position detection apparatus of the present invention is applied to an exposure apparatus for manufacturing semiconductor devices.

FIG. 13 is a schematic diagram illustrating a principal portion when the position detection apparatus of the present invention is applied to an exposure apparatus for manufacturing semiconductor devices utilizing X-rays.

In FIG. 13, an X-ray beam 139 comprises substantially a parallel beam, and illuminates the surface of a mask 134. In addition, an X-ray resist, for example, is coated on the surface of a wafer 135. Reference numeral 133 represents a mask frame. A circuit pattern is patterned on a mask membrane (mask) 134 using an absorber for X-rays. Reference numeral 232 represents a mask support, and reference numeral 136 represents a wafer-fixing member, such as a wafer chuck or the like. Reference numeral 137 represents a z-axis stage which can been tilted. There are also shown an x-axis stage 138, and a y-axis stage 144.

The units having the function of detecting alignment between the mask and the wafer (the position detection apparatuses) described in the foregoing embodiments are accommodated in cases 130a and 130b, from which information relating to the gap and position deviation in directions within the x-y plane between the mask 134 and the wafer 135 is obtained.

While FIG. 13 illustrates the two units 130a and 130b having the alignment detection function, units having the alignment detection function are also provided at two portions corresponding to two sides of a square IC (integrated circuit) circuit pattern area on the mask 134. An optical system and a detection system are accommodated in each of the cases 130a and 130b. Reference numerals 146a and 146b represent alignment detection light beams from the respective alignment systems in units 130a and 130b, respectively.

Signals obtained from these units having the alignment detection function are processed by processing means 140, to obtain the values of the gap, and deviation within the x-y plane. If the obtained values are not within predetermined values, the processing means 140 instructs a driving system controller 145 to drive driving systems 142, 141 and 143 for the stages of the respective axes to move the wafer 135 so that the values become within the predetermined values. Thereafter, the X-ray exposure beam 139 is projected onto the mask 134. An X-ray-shielding member (not shown) protects the mask 134 from being exposed to the X-ray beam until alignment is completed. In FIG. 13, an X-ray source, an X-ray illuminating system and the like are omitted.

Although FIG. 13 illustrates a proximity-type X-ray exposure apparatus, the present invention may also be applied to an optical stepper. The present invention may also be applied to a sequentially-moving reduction projection exposure apparatus or a mirror-projection-type exposure apparatus having a unit magnification, in which illuminating light from a light source emitting, for example, i-line light (having a wavelength of 365 nm), KrF-excimer light (having a wavelength of 248 nm), ArF-excimer light (having a wavelenth of 193 nm), or the like.

Next, a description will be provided of a method for manufacturing semiconductor devices utilizing the above-described projection exposure apparatus.

Figure 14:
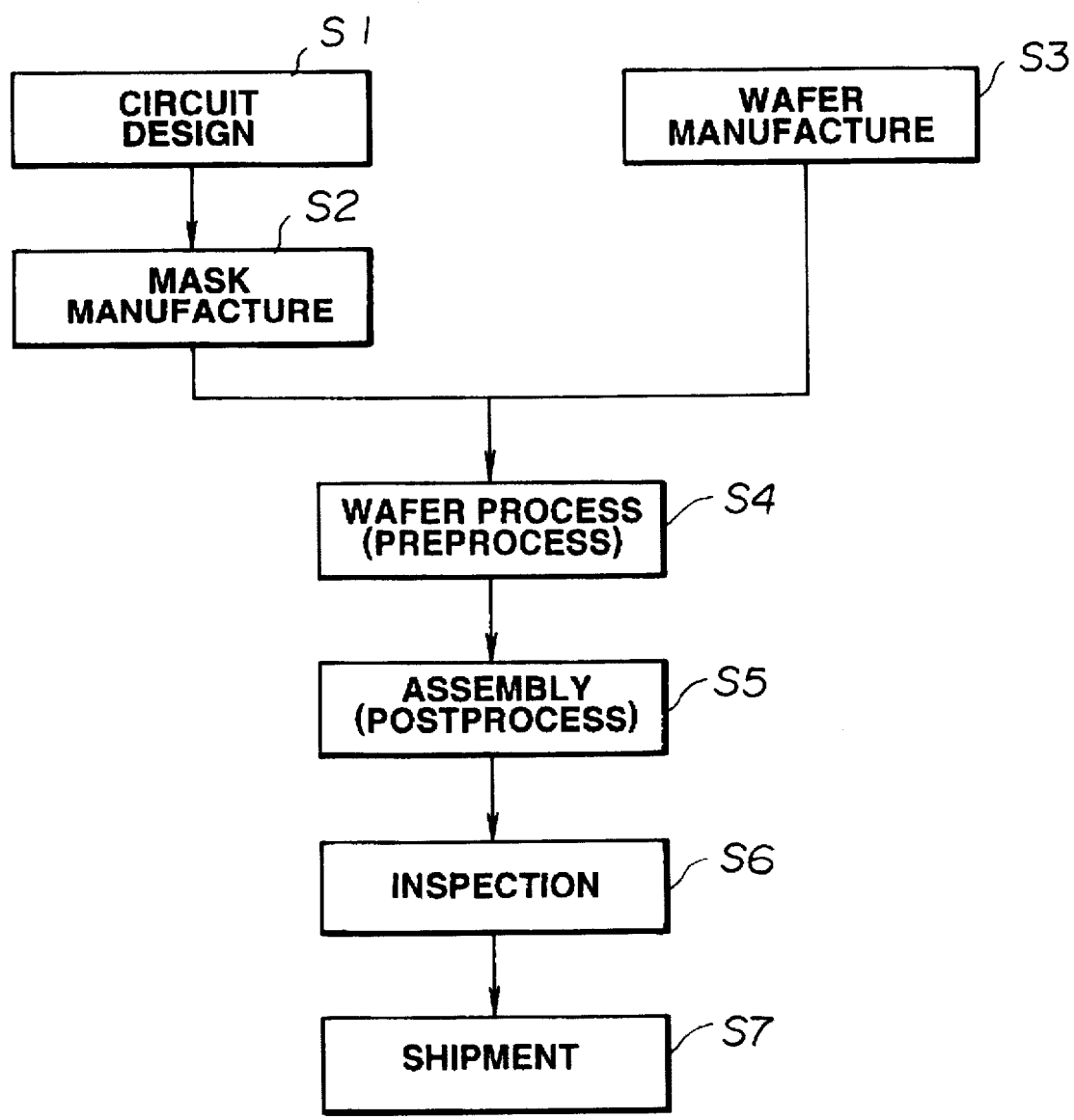
FIGS. 14 and 15 are flowcharts of a method for manufacturing semiconductor devices in the present invention.

FIG. 14 shows a flowchart of a method for manufacturing semiconductor devices (semiconductor chips of IC's, LSI's (large-scale integrated circuits) or the like, liquid-crystal panels, CCD's, or the like).

In step S1 (circuit design), circuit design of semiconductor devices is performed. In step S2 (mask manufacture), masks on which designed circuit patterns are formed are manufactured.

In step S3 (wafer manufacture), wafers are manufactured using a material, such as silicon or the like. Step S4 (wafer process) is called a preprocess, in which actual circuits are formed on the wafers by means of photolithography using the above-described masks and wafers.

The next step S5 (assembly process) is called a postprocess which manufactures semiconductor chips using the wafers manufactured in step 4, and includes an assembling process (dicing and bonding), a packaging process (chip encapsulation), and the like.

In step S6 (inspection), inspection operations, such as operation-confirming tests, durability tests and the like of the semiconductor devices manufactured in step S5, are performed. The manufacture of semiconductor devices is completed after passing through the above-described processes, and the manufactured devices are shipped (step S7).

Figure 15:
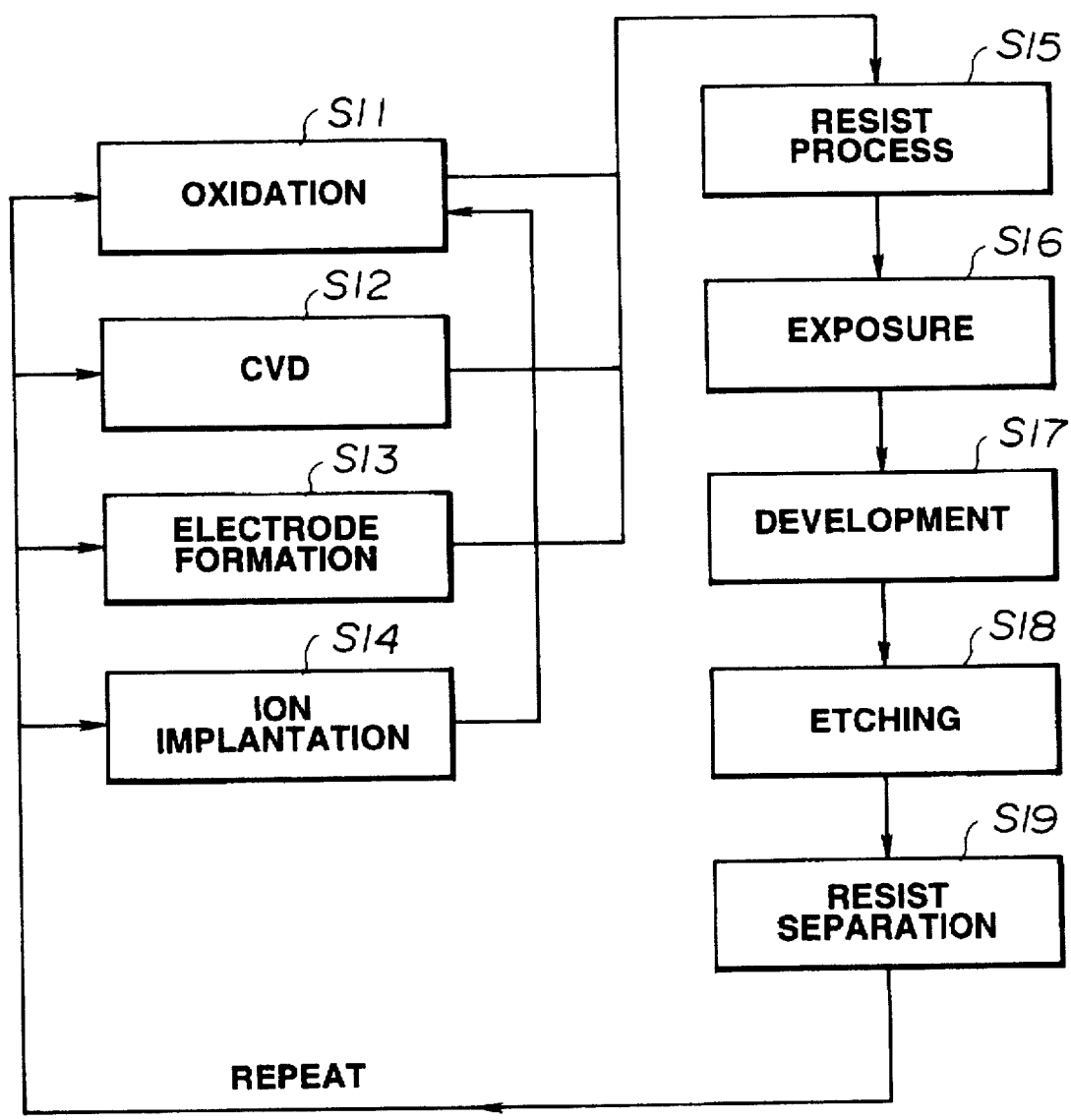

FIG. 15 shows a detailed flowchart of the above-described wafer process in step S4. In step S11 (oxidation), the surface of the wafer is oxidized. In step S12 (CVD), an insulating film is formed on the surface of the wafer.

In step S13 (electrode formation), electrodes are formed on the surface of the wafer by vacuum deposition. In step S14 (ion implantation), ions are implanted into the wafer. In step S15 (resist process), a photosensitive material is coated on the wafer. In step S16 (exposure), the circuit pattern on the mask is exposed and printed on the wafer by the above-described exposure apparatus.

In step S17 (development), the exposed wafer is developed. In step S18 (etching), portions other than the developed resist image are etched off. In step S19 (resist separation), the resist which becomes unnecessary after the completion of the etching is removed. By repeating these steps, a final circuit pattern made of multiple patterns is formed on the wafer.

By using the manufacturing method of the present embodiment, it is possible to easily manufacture semiconductor devices with a high degree of integration which have previously been difficult to manufacture.

The individual components shown in outline or designated by blocks in the drawings are all well known in the position detection apparatus and the semiconductor-device manufacturing method arts and their specific construction and operation are not critical to the operation or the best mode for carrying out the invention.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A position detection apparatus for detecting the relative positional relationship between first and second objects facing each other in a facing direction, said apparatus comprising:

first, second and third marks, each serving as a physical optical element, provided on the first object;

a fourth mark, serving as a physical optical element, provided on the second object;

light projection means for projecting light onto the first object and the second object;

light detection means for detecting a first light beam diffracted by said first mark and reflected by the second object, for detecting a second light beam diffracted by said second mark and reflected by the second object, and for detecting a third light beam diffracted by said third mark and diffracted by said fourth mark, the relative relationship between the incident positions of the first and second light beams on a predetermined surface of said light detection means changing in accordance with the relative positional relationship between the first object and the second object in the facing direction, and the incident position of the third light beam on the predetermined surface and an interval between the position of the center of gravity of the third light beam on an predetermined surface and the midpoint of an interval between the positions of the centers of gravity of the first and second light beams on the predetermined surface changing in accordance with the relative positional relationship between the first object and the second object in a direction perpendicular to the facing direction;

first position detection means for detecting the relative positional relationship between the first object and the second object in the facing direction based on signals representing the first and second light beams from said light detection means; and second position detection means for detecting the relative positional relationship between the first object and the second object in a direction perpendicular to the facing direction based on the interval between the position of the center of gravity of the third light beam on the predetermined surface and the midpoint of the interval between the positions of the centers of gravity of the first and second light beams on the predetermined surface from said light detection means.

2. An apparatus according to claim 1, wherein the incident positions of the first, second and third light beams on the predetermined surface move in the same direction by the same amount on the predetermined surface in response to a change in the inclination of the second object with respect to the first object.

3. An apparatus according to claim 1, wherein the incident positions of the first and second light beams on the predetermined surface move in opposite directions on the predetermined surface in response to a change in the relative position between the first object and the second object in the facing direction.

4. An apparatus according to claim 1, wherein said first position detection means comprises means for detecting the interval between the first and second light beams by detecting the positions of the centers of gravity of the first and second light beams on the predetermined surface.

5. An apparatus according to claim 1, wherein at least one of said first, second, third and fourth marks comprises a grating lens.

6. An apparatus according to claim 1, wherein at least one of said first, second, third and fourth marks comprises a Fresnel zone plate.

7. An apparatus according to claim 1, wherein at least one of said first, second, third and fourth marks comprises a diffraction grating not having a lens function.

8. A position detection method for detecting the relative positional relationship between first and second objects facing each other in a facing direction, said method comprising the steps of:

providing first, second and third marks, each serving as a physical optical element, on the first object;

providing a fourth mark, serving as a physical optical element on the second object;

projecting light onto the first object and the second object;

detecting a first light beam diffracted by the first mark and reflected by the second object, detecting a second light beam diffracted by the second mark and reflected by the second object, and detecting a third light beam diffracted by the third mark and diffracted by the fourth mark, the relative relationship between the incident positions of the first and second light beams on a predetermined surface of light detection means changing in accordance with the relative positional relationship between the first object and the second object in the facing direction, and the incident position of the third light beam on the predetermined surface and an interval between the position of the center of gravity of the third light beam on the predetermined surface and the midpoint of an interval between the positions of the centers of gravity of the first and second light beams on the predetermined surface changing in accordance with the relative positional relationship between the first object and the second object in a direction perpendicular to the facing direction;

detecting the relative positional relationship between the first object and the second object in the facing direction based on signals representing the first and second light beams generated in response to the detecting in said light detecting step; and detecting the relative positional relationship between the first object and the second object in a direction perpendicular to the facing direction based on a signal representing the interval between the position of the center of gravity of the third light beam on the predetermined surface and the midpoint of the interval between the positions of the centers of gravity of the first and second light beams on the predetermined surface generated in response to the detecting in said light detecting step.

9. A method according to claim 8, further comprising the step of moving the incident positions of the first, second and third light beams on the predetermined surface in the same direction by the same amount on the predetermined surface in response to a change in the inclination of the second object with respect to the first object.

10. A method according to claim 8, further comprising the step of moving the incident positions of the first and second light beams on the predetermined surface in opposite directions on the predetermined surface in response to a change in the relative position between the first object and the second object in the facing direction.

11. A method according to claim 8, wherein said first position detection step comprises the step of detecting the interval between the first and second light beams by detecting the positions of the centers of gravity of the two light beams on the predetermined surface.

12. A method according to claim 8, wherein at least one of the first, second, third and fourth marks comprises a grating lens.

13. A method according to claim 8, wherein at least one of the first, second, third and fourth marks comprises a Fresnel zone plate.

14. A method according to claim 8, wherein at least one of the first, second, third and fourth marks comprises a diffraction grating not having a lens function.

15. An exposure apparatus for detecting the positions of marks formed on a wafer, and for transferring a pattern on a mask onto the wafer, wherein the mask and the wafer face each other in a facing direction, said apparatus comprising:

a movable stage for mounting the wafer;

first, second and third marks, each serving as a physical optical element, provided on the mask;

a fourth mark, serving as a physical optical element, provided on the wafer;

light projection means for projecting light onto the mask and the wafer;

light detection means for detecting a first light beam diffracted by said first mark and reflected by the wafer, for detecting a second light beam diffracted by said second mark and reflected by the wafer, and for detecting a third light beam diffracted by said third mark and diffracted by said fourth mark, the relative relationship between the incident positions of the first and second light beams on a predetermined surface of said light detection means changing in accordance with the relative positional relationship between the mask and the wafer in the facing direction, and the incident position of the third light beam on the predetermined surface and an interval between the position of the center of gravity of the third light beam on the predetermined surface and the midpoint of an interval between the positions of the centers of gravity of the first and second light beams on the predetermined surface changing in accordance with the relative positional relationship between the mask and the wafer in a direction perpendicular to the facing direction;

first position detection means for detecting the relative positional relationship between the mask and the wafer in the facing direction based on signals representing the first and second light beams for said light detection means;

second position detection means for detecting the relative positional relationship between the mask and the wafer in a direction perpendicular to the facing direction based on the interval between the position of the center of gravity of the third light beam on the predetermined surface and the midpoint of the interval between the positions of the centers of gravity of the first and second light beams on the predetermined surface from said light detection means; and a control system for causing the wafer to be moved by said movable stage based on the position of the wafer with respect to the mask obtained from said first and second position detection means, and for transferring the pattern on the mask onto the wafer.

16. An apparatus according to claim 15, wherein the incident positions of the first, second and third light beams on the predetermined surface move in the same direction by the same amount on the predetermined surface in response to a change in the inclination of the wafer relative to the mask.

17. An apparatus according to claim 15, wherein the incident positions of the first and second light beams on the predetermined surface move in opposite directions on the predetermined surface in response to a change in the relative position between the mask and the wafer in the facing direction.

18. An apparatus according to claim 15, wherein said first position detection means comprises means for detecting the interval between the first and second light beams by detecting the positions of the centers of gravity of the first and second light beams on the predetermined surface.

19. A method for manufacturing semiconductor devices by detecting the positions of marks formed on a wafer, and for transferring a pattern on a mask onto the wafer, wherein the mask and the wafer face each other in a facing direction, said method comprising the steps of:

providing first, second and third marks, each serving as a physical optical element, on the mask;

providing a fourth mark, serving as a physical optical element, on the wafer;

projecting light onto the mask and the wafer;

detecting a first light beam diffracted by the first mark and reflected by the wafer, detecting a second light beam diffracted by the second mark and reflected by the wafer, and detecting a third light beam diffracted by the third mark and diffracted by the fourth mark, the relative relationship between the incident positions of the first and second light beams on a predetermined surface changing in accordance with the relative positional relationship between the mark and the wafer in the facing direction, and the incident position of the third light beam on the predetermined surface and an interval between the position of the center of gravity of the third light beam on the predetermined surface and the midpoint of an interval between the positions of the centers of gravity of the first and second light beams on the predetermined surface changing in accordance with the relative positional relationship between the mask and the wafer in a direction perpendicular to the facing direction;

detecting the relative positional relationship between the mask and the wafer in the facing direction based on signals representing the first and second light beams generated in response to the detecting in said light detecting step;

detecting the relative positional relationship between the mask and the wafer in a direction perpendicular to the facing direction based on the interval between the position of the center of gravity of the third light beam on the predetermined surface and the midpoint of the interval between the positions of the centers of gravity of the first and second light beams on the predetermined surface generated in response to the detecting in said light detecting step; and moving the wafer based on the position of the wafer with respect to the mask obtained from said first and second position detecting steps, and transferring the pattern on the mask onto the wafer.

* * * * *

UNITED STATES PATENT AND TRADEMARK OFFICE
CERTIFICATE OF CORRECTION

PATENT NO. : 5,717,492
DATED : February 10, 1998
INVENTOR(S) : Koichi Sentoku, et al.

Page 1 of 3

It is certified that error appears in the above-identified patent and that said Letters Patent is hereby corrected as shown below:

[57] ABSTRACT

Line 8, "objects" should be --objects.--.

Column 3

Line 1, "aspect" should read --aspect,-- and "inventions" should read --invention,--.

UNITED STATES PATENT AND TRADEMARK OFFICE
CERTIFICATE OF CORRECTION

PATENT NO.   :   5,717,492
DATED        :   February 10, 1998
INVENTOR(S)  :   Koichi Sentoku, et al.

It is certified that error appears in the above-identified patent and that said Letters Patent is hereby corrected as shown below:

Column 5

Line 25, "Optical" should read --optical--.

Column 7

Line 13, "(62)." should read --(52).--.
    Line 30, "do" should read --$d_o$--.

Column 8

Line 23, "S" should read --5--.

UNITED STATES PATENT AND TRADEMARK OFFICE
CERTIFICATE OF CORRECTION

PATENT NO. : 5,717,492
DATED : February 10, 1998
INVENTOR(S) : Koichi Sentoku, et al.

It is certified that error appears in the above-identified patent and that said Letters Patent is hereby corrected as shown below:

Column 10

Line 22, "38" (second occurrence) should read --36--.
    Line 67, "86" should read --56--.

Column 11

Line 2, "S1" should read --51--.
    Line 15, "56" should read --55--.

Column 12

Line 8, "do" should read --$d_o$--.
    Line 37, "do" should read --$d_o$--.
    Line 59, "dO+Δd" should read --$d_o+\Delta d$--.

Signed and Sealed this

First Day of September, 1998

Attest:

BRUCE LEHMAN

Attesting Officer      Commissioner of Patents and Trademarks